United States Patent
Heydari et al.

(10) Patent No.: US 8,820,113 B2
(45) Date of Patent: Sep. 2, 2014

(54) COOLING COMPUTING DEVICES IN A DATA CENTER WITH AMBIENT AIR COOLED USING HEAT FROM THE COMPUTING DEVICES

(75) Inventors: Ali Heydari, Berkeley, CA (US); Marco Magarelli, Stockton, CA (US)

(73) Assignee: Facebook, Inc., Menlo Park, CA (US)

( * ) Notice: Subject to any disclaimer, the term of this patent is extended or adjusted under 35 U.S.C. 154(b) by 746 days.

(21) Appl. No.: 12/651,282

(22) Filed: Dec. 31, 2009

(65) Prior Publication Data

US 2011/0154842 A1 Jun. 30, 2011

(51) Int. Cl.
- F25B 1/00 (2006.01)
- F25B 27/00 (2006.01)
- F25D 23/12 (2006.01)
- F25B 15/00 (2006.01)
- H05K 7/20 (2006.01)
- F25B 27/02 (2006.01)

(52) U.S. Cl.
CPC ................................ H05K 7/20836 (2013.01); F25B 27/02 (2013.01)
USPC ............ 62/498; 62/259.2; 62/29.4; 62/235.1; 62/476; 62/201; 62/141; 62/171; 62/304; 62/121; 361/687; 361/699; 361/700; 361/701; 361/702

(58) Field of Classification Search
USPC ............ 62/259.2, 29.4, 235.1, 476, 201, 141, 62/171, 304, 121; 361/687, 699–702
See application file for complete search history.

(56) References Cited

U.S. PATENT DOCUMENTS

| | | | |
|---|---|---|---|
| 4,757,690 A | 7/1988 | Holowczenko et al. | |
| 6,050,100 A * | 4/2000 | Belding et al. | 62/271 |
| 6,122,922 A | 9/2000 | Conner | |
| 7,724,517 B2 * | 5/2010 | Attlesey et al. | 361/679.53 |
| 8,151,578 B1 * | 4/2012 | Morales et al. | 62/91 |
| 8,164,901 B2 * | 4/2012 | Neudorfer | 361/699 |
| 2003/0029185 A1 | 2/2003 | Kopko | |
| 2003/0041608 A1 * | 3/2003 | Gonzalez-Cruz et al. | 62/235.1 |
| 2005/0200205 A1 | 9/2005 | Winn et al. | |
| 2007/0261421 A1 * | 11/2007 | Pierson | 62/175 |
| 2007/0261819 A1 * | 11/2007 | Lin | 165/80.4 |
| 2008/0029250 A1 * | 2/2008 | Carlson et al. | 165/104.33 |
| 2009/0014158 A1 | 1/2009 | Gu | |
| 2009/0234705 A1 * | 9/2009 | Brunschwiler et al. | 705/10 |
| 2009/0268404 A1 * | 10/2009 | Chu et al. | 361/696 |
| 2011/0096503 A1 * | 4/2011 | Avery et al. | 361/701 |

OTHER PUBLICATIONS

PCT International Search Report and Written Opinion, PCT Application No. PCT/US2010/059862, Feb. 14, 2011, eight pages.

* cited by examiner

*Primary Examiner* — Frantz Jules
*Assistant Examiner* — Erik Mendoza-Wilkenfe
(74) *Attorney, Agent, or Firm* — Fenwick & West LLP (57) ABSTRACT

To reduce power consumption and more efficiently cool computing devices in a data center, an air supply unit supplies air from outside the data center to an air handling unit, which cools servers within the data center using the supplied air. Using air from outside the data center, rather than recirculating and cooling air from within the data center, reduces the power consumption of the data center. In an embodiment, a chiller and/or an evaporative cooling system are coupled to the air supply unit to allow further cooling of the outside air before it is circulated. Heat generated by the servers within the data center is collected, for example using thermal pathways coupled to server components, and used by the chiller in an absorption or adsorption process to further reduce power consumption of the data center and allow the air handling unit to further cool the outside air.

34 Claims, 4 Drawing Sheets

COOLING COMPUTING DEVICES IN A DATA CENTER WITH AMBIENT AIR COOLED USING HEAT FROM THE COMPUTING DEVICES

BACKGROUND

This invention relates generally to data centers, and more particularly to efficient cooling of computing devices within a data center.

Heat removal is a prominent factor in computer system and data center design. The number of servers deployed within a data center has steadily increased as server performance has improved, thereby increasing the amount of heat generated during the regular operation of the servers. The reliability of servers used within a data center decreases if the environment in which they operate is permitted to increase in temperature over time. A significant portion of the data center's power is used for cooling electronics at the server level. As the number or servers within a data center increase, a greater portion of the power is commensurately consumed by the data center to cool electronic components within the servers.

In conventional data structures, a Computer Room Air Conditioner ("CRAC") circulates cold air throughout a data center. Conventionally, the CRAC is a closed-loop system that cools returning air drawn from within the data center and recirculates the cooled air to the servers within the data center. Because air drawn by the CRAC originates within the data center, the air has an increased temperature from cooling the servers in the data center. As the power used by the servers within a data center increases, so does the power used by the CRAC to cool the return air. This closed loop also increases the power and associated cost for data center operation.

SUMMARY

Embodiments of the invention reduce the power used to cool servers in a data center, at least under normal operating conditions. In one embodiment, a data center comprises a structure which includes a plurality of servers arranged inside a partitioned space within the structure. An air supply unit receives air from an external environment to the data center structure rather than receiving the return air from within the structure. A chiller is coupled to a return line that captures heat generated by operation of the plurality of servers. By using the captured heat in an adsorption process or in an absorption process, the chiller produces a refrigerant, which is received by an evaporator and used to generate a chilled fluid. The chilled fluid is directed to an air handling unit, which receives air from the air supply unit and cools the air using the chilled fluid. The air handling unit then directs the cooled air towards and through the plurality of server to cool the electrical components within the servers. In one embodiment, an evaporative cooling system receives air from the air supply unit and evaporatively cools the air before it reaches the air handling unit, thereby further cooling the air.

To capture heat generated during server operation, the chiller may be coupled to a supply line that directs a fluid from the chiller to one or more locations proximate to the plurality of servers. The supply line comprises a thermally conductive material so that heat expelled from the plurality of servers is at least partially absorbed by the fluid, generating a warmed fluid. A return line is coupled to the supply line and directs the warmed fluid back to the chiller, which uses the warmed fluid in an absorption cooling process or in an absorption cooling process to produce refrigerant for use in cooling the external air received from the air supply unit. In one embodiment, a thermal storage unit is coupled to the return line and receives the warmed fluid before the chiller. A heat source, such as a gas heater, an electric heater, solar panels or another source provides additional heat to the thermal storage unit, further increasing the temperature of the warmed fluid in the thermal storage unit. The additionally heated warmed fluid is then directed to the chiller. In another embodiment, a cold thermal storage unit is coupled to the supply line and receives chilled or cooled fluid from the chiller. Additionally, one or more thermal pathways may be coupled to components within a server and capture heat generated by the internal server components during operation. The thermal pathways communicate the captured heat to the supply line, which directs the captured heat to the return line and, in turn, to the chiller.

In one embodiment, a sensor monitors air temperature or air humidity within the structure and communicates with a control system to modify operation of the absorption chiller. For example, if the air temperature inside the structure is greater than or equal to a threshold value, the control system produces a control signal to activate the absorption chiller (or the adsorption chiller) to cool the air flowing to the computer room air conditioner. In this way, the chiller is activated only when needed, so if the ambient air is sufficient to cool the computing devices in the data center then energy is not consumed by running the chiller. Additionally, the data center may include one or more exhaust units that are arranged to expel air from inside the data center (e.g., once the air is heated after it has been used to cool the servers).

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Data Center Architecture

Figure 1:
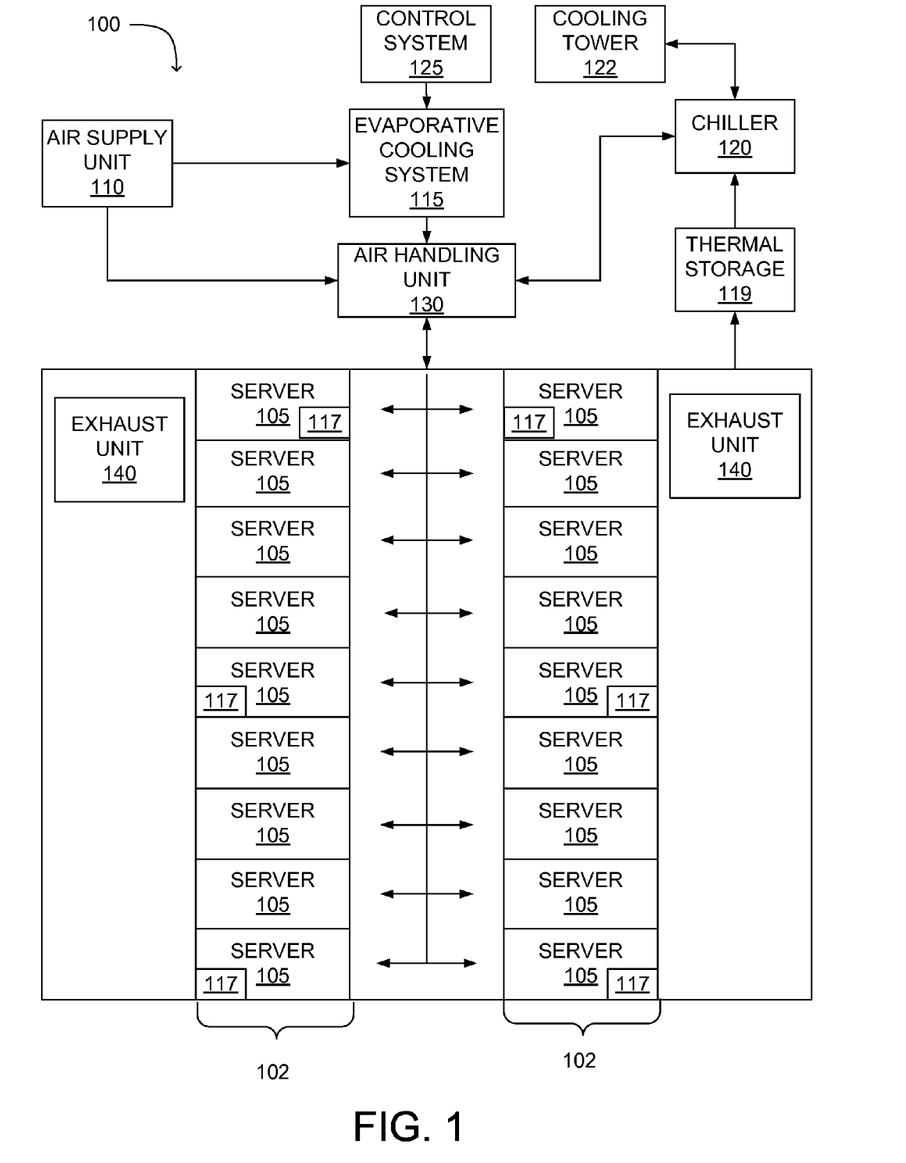
FIG. 1 is a functional block diagram of a data center using ambient air and a chiller receiving heat generated during server operation to cool servers in accordance with an embodiment of the invention.

An example data center 100 cooling one or more servers 105 is illustrated in FIG. 1. In one embodiment, the data center 100 comprises a structure including a plurality of servers 105. For example, the data center 100 comprises a room or building housing a plurality of servers 105. The data center includes an air supply unit 110 having an input opening coupled to an environment external to the structure including a plurality of servers 105. The air supply unit 110 directs this outside air to an air handling unit 130, such as a Computer Room Air Conditioner ("CRAC") 130 or similar Heating, Ventilating and Air Conditioning ("HVAC") unit. The air handling unit 130 circulates the outside air throughout the data center 100 to cool the one or more servers 105 included in the data center 100. The air supply unit 110 may comprise one or more fans, louvers or other similar device coupled to an environment external to the data center 100 and configured to direct air from the external environment to the data center 100. For example, the air supply unit 110 may comprise a fan that is coupled to an environment outside of the data center 100. By drawing air from outside of the structure, rather than using return air that was previously used for server 105 cooling, the air supply unit 110 may obtain exterior air having a lower temperature as compared to returning air inside the structure that has been used to cool the servers 105.

In different embodiments, the position of the air handling unit 130 relative to the one or more servers 105 may differ. For example, the air handling unit 130 may be positioned above, below, or to the side of the servers 105. While FIG. 1 shows an embodiment with a single air handling unit 130, in some embodiments, multiple air handling units 130 supply air to the data center 100 and may have different positions relative to the servers 105. For example, air handling units 130 are positioned above and below or below and to the side of different groups of servers 105.

In an embodiment, the data center 100 also includes one or more exhaust units 140, such as exhaust fans, which extract air from the structure including the plurality of servers 105. The exhaust units 140 allow removal of air that has absorbed heat generated during operation of the servers 105. While FIG. 1 shows an example data center 100 with two exhaust units 140, in other embodiments a different number of exhaust units 140 may be included. In an embodiment, the exhaust units 140 direct air from the data center 100 into an environment external to the data center 100. In alternative embodiments, the exhaust units 140 may direct air from the data center 100 into other systems which make use of the elevated temperature of this return air.

A partition 102 includes one or more servers 105 oriented so that air circulated by the CRAC 130 flows to and through the servers 105, or other electronic devices. The partition 102 includes one or more openings through which air is able to flow. In an embodiment, the partition 102 comprises a rack or other structure to which the one or more servers 105 may be attached. For example, the one or more servers 105 are mounted to one or more racks and may have different sizes. In an embodiment, the partition 102 is configured so that air flow paths external to the servers 105 are substantially blocked to increase the amount of air flowing through the servers 105. As further described below in conjunction with FIG. 2, the partition 102 is configured to receive a fluid or gas from a chiller 120, and direct the fluid or gas so that a portion of the heat generated during operation of the servers 105 is absorbed by the fluid or gas to produce a warmed fluid or gas that is directed back to the chiller 120.

In different embodiments, the air supply unit 110 is coupled to an evaporative cooling system 115 and/or the chiller 120, which reduce the temperature and/or modify the humidity of the outside air before circulation by the air handling unit 130. The evaporative cooling system 115 blows a fine mist of liquid, such as water, into the outside air received from the air supply unit 110. As the liquid evaporates, heat is extracted from the outside air. Although the evaporative cooling system 115 reduces the temperature of the outside air, the mist blown into the outside air increases the humidity of the air output from the evaporative cooling system 115. In an alternative embodiment, the evaporative cooling system 115 is replaced by chilled water coils to extract heat from the outside air.

In the embodiment shown by FIG. 1, the chiller 120 includes an evaporator, which is used to supply a coolant, such as chilled water, to the air handling unit 130 to further extract heat from the received air. In various embodiments, the chiller 120 comprises an absorption chiller or an adsorption chiller. To reduce the power used by the chiller 120, the partition 102 is configured so that the heat generated during operation of the servers 105 is captured and directed to the chiller 120, which uses the heat to produce a refrigerant that is used by the evaporator to produce a coolant used by the air handling unit 130 to reduce the temperature of air from the air supply unit 110 or from the evaporative cooling system 115. For example, a fluid or gas flows from the chiller 120 to one or more partitions 102, where the fluid or gas flows across or in proximity to servers 105 included in the one or more partitions 102 and absorbs a portion of the heat generated during operation of the servers 105. This increases the temperature of the fluid or gas. In one embodiment, the heated fluid or gas is directed from one or more partitions 102 to a thermal storage unit 119, further described below in conjunction with FIG. 2, which receives and imparts further heat to the fluid or gas before the fluid or gas is received by the chiller 120. The heated fluid or gas is directed back to the chiller 120, where it is used to produce a refrigerant. For example, the refrigerant is used by an absorption process or by an adsorption process to produce a coolant used by the air handling unit 130 to reduce the temperature of received air. Example configurations of the partition 102 to capture heat for use by the chiller 120 is further described below in conjunction with FIGS. 2-4.

In one embodiment, the chiller includes two chambers. The first chamber receives the heated fluid to regenerate a sorbent material. The second chamber receives a cooled fluid, such as water, from a cooling tower 122 and also includes the sorbet material. Vapor from an evaporator included in the chiller is adsorbed by the sorbent material in the second chamber.

In another embodiment, a heat source provides heat to the evaporator included in the chiller 120. The evaporator receives a coolant and extracts heat from received air, such as air from the air supply unit 110 or from the evaporative cooling system 115, by causing the coolant to evaporate and be absorbed by an absorbent. For example, the coolant is produced by a condenser included in the chiller 120, which cools a refrigerant vapor using a cooled fluid from the cooling tower 122. The combination of refrigerant and absorbent is used by a generator included in the chiller 120, which uses heat captured from server 105 operation to separate the refrigerant from the absorbent, allowing the refrigerant to be cooled and recirculated.

The data center 100 also includes one or more sensors 117 for monitoring air temperature, air humidity, air flow, air pressure, or any other data describing air temperature within the data center 100. In embodiments, the one or more sensors 117 may be configured to monitor various combinations of data describing temperature, pressure and/or humidity or air in the data center 100. FIG. 1 shows an embodiment where the sensors 117 are placed in locations along the partition 102 to monitor data describing air proximate to one or more servers 105. In other embodiments, sensors 117 are placed in various locations throughout the data center 100.

The sensors 117 communicate with a control system 125 coupled to the evaporative cooling system 115 and/or the chiller 120. The control system 125 generates control signals modifying how air is cooled by the evaporative cooling system 115 or modifying operation of the chiller 120 cools air. In one embodiment, the control system 125 generates a control signal responsive to data from one or more sensors 117, where the control signal modifies operation of the evaporative cooling system 115 and/or the chiller 120. For example, responsive to detecting an air temperature less than or equal to a threshold value, the control signal deactivates the evaporative cooling system 115 or the chiller 120 to reduce power consumption. Similarly, responsive to the sensors 117 detecting an air temperature above the threshold value, the control system 125 produces a control signal activating the evaporative cooling system 115 and/or the chiller 120 to enable additional cooling of outside air using the evaporative cooling system 115. As another example, responsive to the sensors 117 detecting a humidity less than or equal to a threshold value, the control system 125 generates a control signal activating the evaporative cooling system 115 while deactivating the chiller 120 to increase the humidity of the air supplied to the data center 100. Additionally, responsive to the sensors 117 determining a humidity greater than or equal to a threshold value, the control system 125 generates a control signal deactivating the evaporative cooling system 115 while activating the chiller 120 to decrease the humidity of the air supplied to the data center 100. Hence, the sensors 117 and control system 125 implement a feedback loop allowing the data center 100 to modify properties of the air flowing into the data center 100 responsive to changes in the data center environment, making more efficient use of power by altering the components used. While the above-described examples describe control signal generation based on temperature data, pressure data or other types of data about the air inside the data center 100.

Figure 2:
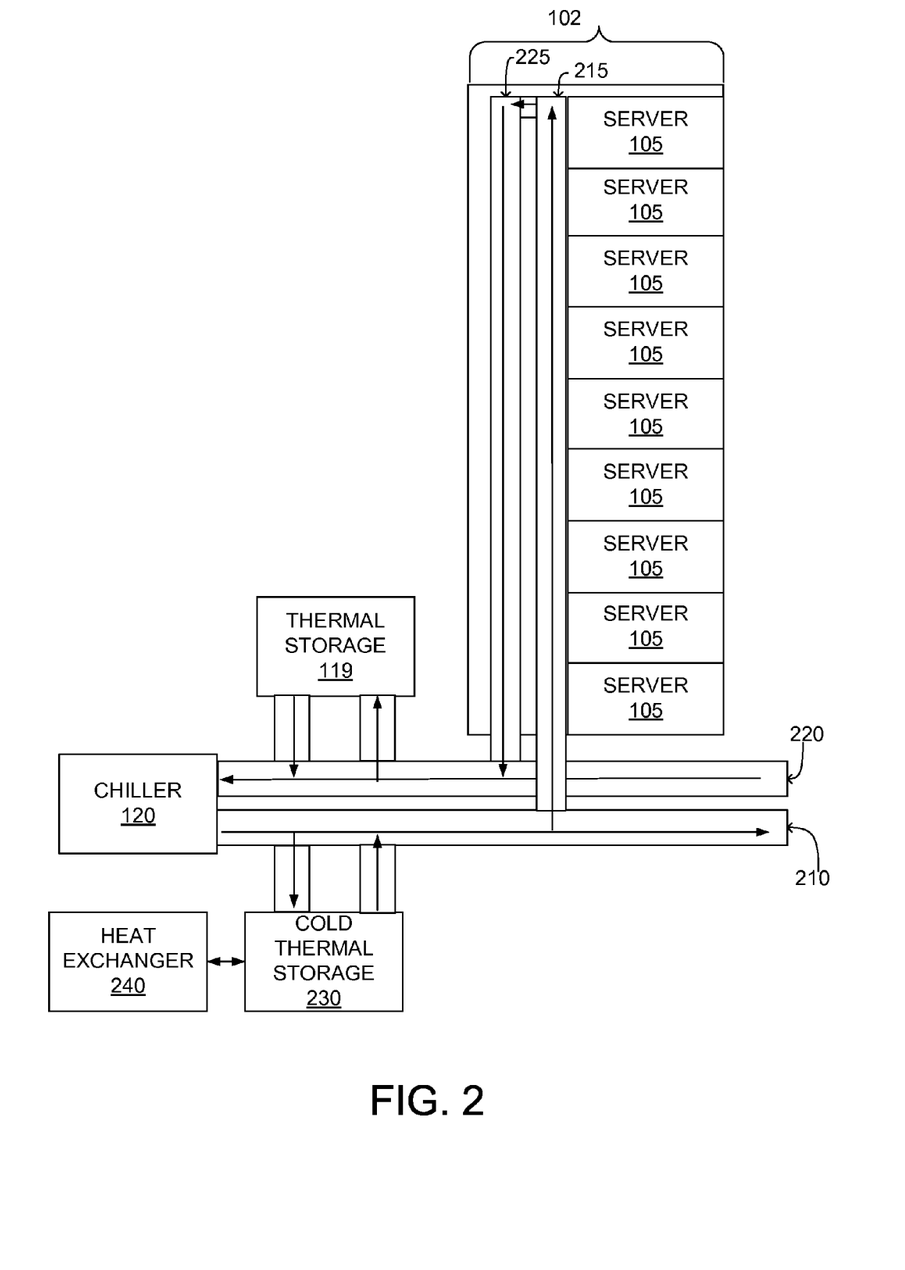
FIG. 2 is a side view of a data center partition configured to supply heat generated during server operation to a chiller for cooling ambient air in accordance with an embodiment of the invention.

FIG. 2 is a side view of one embodiment of a partition 102 in a data center 100 configured to supply heat generated during operation of one or more servers 105 to a chiller 120. A fluid, such as a gas or a liquid, or other medium with the ability to absorb heat, flows from the chiller 120 through a supply line 210 into the data room 100. One or more partition supply lines 215 are located adjacent to the servers 105 included in one or more partitions 102 and an input opening of each partition supply line 215 is coupled to the supply line 210. Fluid from the supply line 210 is directed along the partition 102 by the partition supply line 215 to locations proximate to the servers 105. As the servers 105 operate, heat is generated by electronic components within the servers 10 and is expelled from the servers 105 by one or more cooling systems. The partition supply lines 215 are positioned so that heat expelled from the servers 105 flows around the partition supply lines 215. In an embodiment, the partition supply lines 215 are constructed from a material that conducts heat from the environment outside of the partition supply lines 215 into the fluid included in the partition supply lines 215. For example, a partition supply line 215 is positioned adjacent to an exhaust opening of a server 105 so that fluid inside the partition supply line 215 is warmed by heat expelled by the server 105 during operation in a heat exchange process.

In one embodiment, a cold thermal storage unit 230 is coupled to the supply line 210 and receives fluid from the supply line 210 before the fluid is directed to one or more partition supply line 215. This provides a thermal buffer of chilled or cooled fluid or gas when other systems are not capable of actively producing chilled or cooled fluid or gas. In one embodiment if the server 105 operation decreases, insufficient heat may be generated to heat the fluid, impairing the performance of the chiller 120. Hence, to bridge time where chiller 120 performance is not present or the system is in an economization mode such as during periods of low server 105 operation, fluid from the chiller 120 is directed to the cold thermal storage unit 230 via the supply line 210. A heat exchanger 240 is coupled to the cold thermal storage unit 230 and cools fluid received from the cold thermal storage unit 230. The cooled fluid is then directed to the servers 105 via the supply line 210. The control system 125 may generate a control signal that directs fluid from the chiller 120 to the cold thermal storage unit 230 based on data captured from the sensors 117 or from data captured from one or more servers 105.

In an alternative embodiment, a thermal storage unit 119 is coupled to the return line 220 and receives fluid that has been warmed by operation of the servers 105 and stores the warmed fluid. A heat source, such as a gas heater, an electric heater, solar panels, waste heat produced by a generator, or another source provides additional heat to the thermal storage unit 119, further increasing the temperature of the warmed fluid in the thermal storage unit 119. The additionally heated warmed fluid is then directed to the chiller 120 via the return line 220. Hence, the thermal storage unit 119 allows the temperature of the warmed fluid to be further increased to improve performance of the chiller 120. In one embodiment, the thermal storage unit 119 also receives fluid from a heat exchanger 240 and further increases the temperature of the fluid warmed by the heat exchanger 240. One or more sensors may be included along the return line 220 to monitor the temperature of the warmed fluid, these sensors communicate with the control system 125, which generates a control signal that opens a valve, or other opening, to direct the warmed fluid to the thermal storage unit 119 responsive to the temperature of the warmed fluid reaching a threshold temperature.

Figure 3:
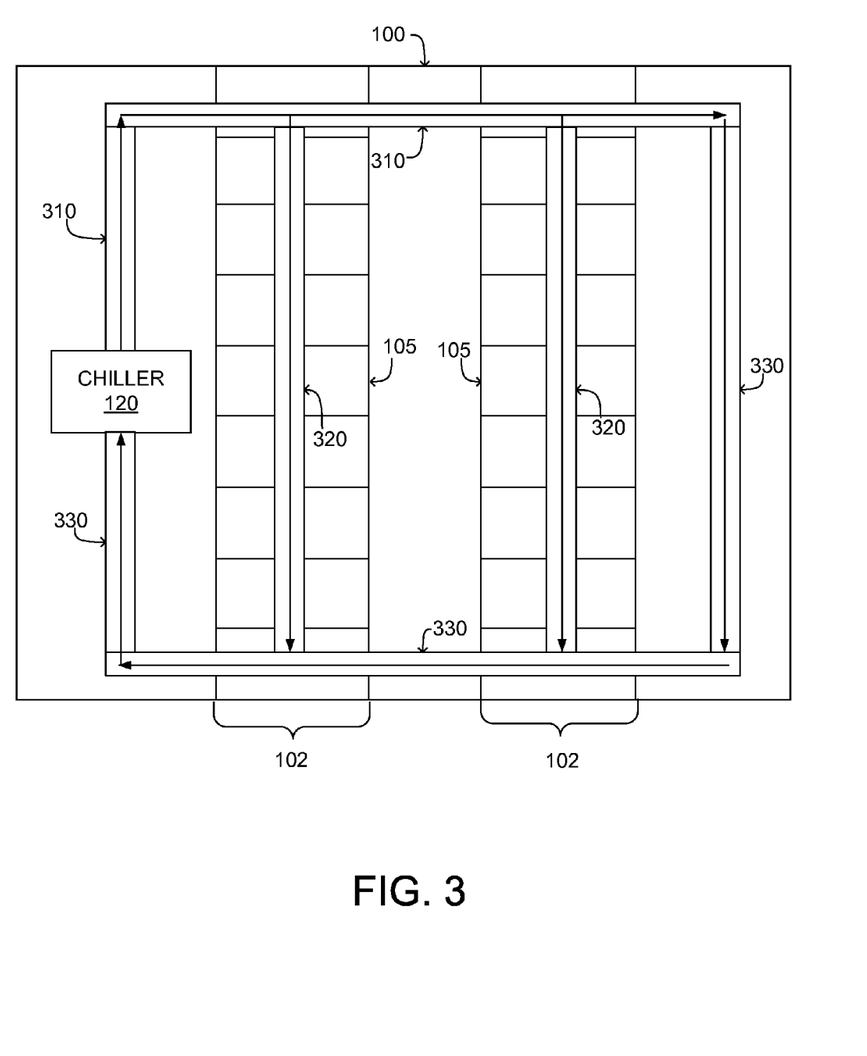
FIG. 3 is an overhead view of an alternative data center configuration for supplying heat generated during server operation to a chiller for cooling ambient air in accordance with an embodiment of the invention.

While FIG. 2 depicts an embodiment where the partition supply line 215 is vertically oriented along the partition 102, in other embodiments, the partition supply line 215 may have a different orientation. For example, the partition supply line 215 may be horizontally oriented or have any other orientation. FIG. 3, further described below, depicts an alternative configuration for supplying heat generated during server 105 operation to the chiller 102.

After being warmed, fluid inside the partition supply line 215 is directed into a partition return line 225 by an output opening of the partition supply line 215 coupled to an input opening of the partition supply line 215. An output opening of the partition return line 225 is coupled to an input opening of a return line 220, which receives warmed fluid from the partition return line 225 and directs the warmed fluid to the chiller 120. In an embodiment, the partition return line 225 and the return line 220 are insulated to reduce the amount of heat lost by the warmed fluid while returning to the chiller 120. In one embodiment, heat from the warmed fluid from the return line 220 is then used by a generator included in the chiller 120 to boil off moisture absorbed by an absorbent. In this way, heat generated during conventional operation of the servers 105 is harnessed and used by the chiller 120 in a process for cooling air from the air supply unit 110 or from the evaporative cooling system 115, reducing the power used during operation of the chiller 120.

FIG. 3 is an overhead view of an alternative configuration for a data center 100 for supplying heat generated during server 105 operation to a chiller 120. A fluid, such as a gas or a liquid, or other medium with the ability to capture or absorb heat, flows throughout the data room 100 via a supply line 310. In an embodiment, the supply line 310 is positioned above the partitions 102 and travels along an outer perimeter of the data center 100 structure. For example, the supply line 310 is positioned along walls of a room including the plurality of servers 105.

To direct the fluid to one or more locations proximate to the servers 105, input openings of the one or more partition supply lines 320 are coupled to the supply line 310. The input openings direct the fluid through one or more partition supply lines 320 positioned adjacent to one or more partitions 102. In an embodiment, the partition supply lines 320 are positioned above one or more partitions. Alternatively, the partition supply lines 320 are positioned adjacent to the servers 105 included in one or more partitions 102. Servers 105 within the partition 102 generate heat during operation and cooling systems expel this heat from the servers 105. The partition supply lines 320 are positioned so that heat expelled from the servers 105 flows around the partition supply lines 320. In an embodiment, the partition supply lines 320 are constructed from a thermally conductive material allowing heat from the environment outside of the partition supply lines 320 to warm the fluid travelling through the partition supply lines 320.

Output openings from the partition supply lines 320 are coupled to input openings of a return line 330, which directs fluid to the absorption chiller 120 after the fluid has been warmed by operation of the servers 105. In an embodiment, the return line 320 is insulated to reduce the amount of heat dissipated by the warmed fluid as it travels to the absorption chiller 120. In one embodiment, the partition supply lines 320 and return line 330 allow a generator included in the chiller 120 to use heat generated during operation of the server 105 to boil off moisture absorbed by an absorbent, reducing the power consumption of the chiller 120.

Capture of Heat from Server Operation

Figure 4:
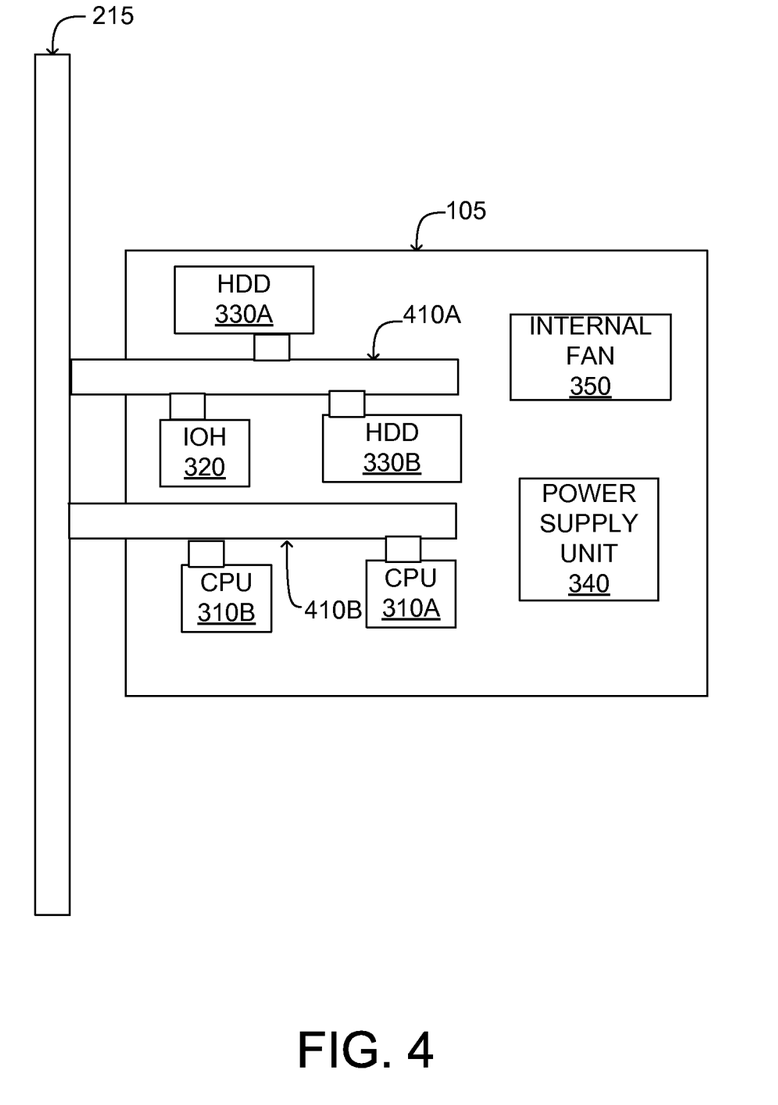
FIG. 4 is an overhead view of an example server configuration for capturing heat generated during server operation in accordance with an embodiment of the invention.

FIG. 4 is an overhead view of an example server 105 configuration for capturing heat generated during server operation. As shown in the example of FIG. 4, the server 105 includes one or more processors 310A, 310B, an input/output handler 320, one or more hard disk drives 330A, 330B, a power supply unit 340 and an internal fan 350. However, in other configurations, the server 105 includes different and/or additional components than those depicted by FIG. 4.

One or more thermal pathways 410A, 410B are coupled to the partition supply line 215 and to one or more components within the server 105. In the example of FIG. 4, a first thermal pathway 410A is coupled to the hard disk drives 330A, 330B and to the input/output handler 320. Similarly, a second thermal pathway 410B is coupled to the processors 310A, 310B. The thermal pathways 410 capture heat generated by the components within the server 105 during operation and communicate the captured heat to the supply line 215. The thermal pathways 410 may be implemented in a variety of ways, such as heat pipes, vapor chambers, carbon nanotubes, liquid lines, vapor paths, metal connections coupled to the server components, or any other suitable method for capturing generated heat and directing the captured heat to the partition supply line 215. Alternatively, the thermal pathways 410 are implemented using a vapor compression system, where heat from one or more components included in the server 150 is absorbed using an evaporator included in the vapor compression system. A condenser included in the vapor compression system releases the absorbed heat into the partition supply line 215.

In an alternative embodiment, the server components are immersed in a dielectric liquid, which captures heat generated during component operation. The dielectric liquid is directed through the partition supply line 215 to direct the captured heat to the chiller 120.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium, which include any type of tangible media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A data center system comprising:
a structure including plurality of servers within the structure;
an air supply unit having an input opening for receiving air from an environment external to the structure;
a chiller thermally coupled to the plurality of servers by a return line to receive a fluid that captures heat generated by operation of the plurality of servers, the chiller configured to cool a refrigerant using the captured heat in an absorption or adsorption process, wherein the fluid is a liquid;
a supply line coupled to the chiller, coupled to the return line and adjacent to exhaust openings of the plurality of servers, the supply line configured to direct the fluid from the chiller to a location proximate to the plurality of servers and to the return line, wherein the fluid directed via the supply line is warmed by capturing heat expelled from an exhaust opening of a server from the plurality of servers during operation and is then further warmed by capturing heat generated from an exhaust opening of a different server from the plurality of servers during operation before the supply line directs the fluid to the return line;
one or more thermal pathways coupled to the supply line and to one or more components within a server of the plurality of servers, the one or more thermal pathways capturing heat generated by the one or more components during operation and communicating the captured heat to the fluid in the supply line wherein the one or more thermal pathways comprise one or more carbon nanotubes; and an air handling unit coupled to receive air from the environment external to the structure via the air supply unit and to receive a refrigerant from the chiller, the air handling unit configured to cool the received air from the environment external to the structure via the air supply unit using the refrigerant and to direct the cooled received air toward the plurality of severs.

2. The data center system of claim 1, further comprising an evaporative cooling system configured to receive air from the air supply unit, generate evaporatively cooled air, and supply the evaporatively cooled air to the air handling unit.

3. The data center system of claim 1, further comprising one or more sensors for monitoring an attribute of air proximate to the plurality of servers, the one or more sensors coupled to a control system which is coupled to the chiller, the control system for generating a control signal modifying operation of the chiller responsive to the attribute.

4. The data center system of claim 3, wherein the control system is configured to generate a control signal to deactivate the chiller responsive to a temperature of the air proximate to the plurality of servers being less than or equal to a threshold value.

5. The data center system of claim 3, wherein the control system is configured to generate a control signal to activate the chiller responsive to a temperature of the air proximate to the plurality of servers equaling or exceeding a threshold value.

6. The data center system of claim 1, further comprising a thermal storage unit coupled to the return line and to the chiller, the thermal storage unit configured to receive the fluid, warm the fluid using heat received from a heat source, and direct the additionally warmed fluid to the chiller.

7. The data center system of claim 6, wherein the heat source comprises at least one of a solar panel, a gas heater, and an electric heater.

8. The data center system of claim 1, further comprising:
a cold thermal storage unit coupled to the supply line, the cold thermal storage unit configured to capture the fluid before the fluid reaches the return line; and
a heat exchanger coupled to the cold thermal storage unit, the heat exchanger configured to cool the fluid and direct the cooled fluid to the plurality of servers.

9. The data center system of claim 1, wherein the chiller comprises an adsorption chiller, wherein the captured heat is used to regenerate a sorbent material.

10. The data center system of claim 9, further comprising:
a cooling tower coupled to the chiller, the cooling tower configured to supply a cooled fluid to the chiller to remove heat generated by the chiller.

11. The data center system of claim 1, wherein the chiller comprises an absorption chiller.

12. The data center system of claim 11, further comprising:
a cooling tower coupled to the chiller, the cooling tower configured to extract heat from a refrigerant vapor produced by the chiller using the captured heat; and
an evaporator coupled to the chiller, the evaporator configured to receive the refrigerant after heat is extracted and generate a coolant having a temperature reduced by boiling of the refrigerant, the coolant directed to the air handling unit to cool the air from the air supply unit.

13. The data center system of claim 1, further comprising:
an exhaust unit external to the plurality of servers and configured to extract air from the structure.

14. A data center system comprising:
a structure including plurality of servers arranged within the structure;
an air supply unit having an input opening for receiving air from an environment external to the structure;
a supply line adjacent to exhaust openings of the plurality of servers, configured to direct a fluid to a location proximate to the plurality of servers, where the fluid absorbs heat generated by operation of the plurality of servers to produce a warmed fluid and the fluid is a liquid;
one or more thermal pathways coupled to the supply line and to one or more components within a server in the structure, the one or more thermal pathways capturing heat generated by the one or more components during operation and communicating the captured heat to the fluid in the supply line wherein the one or more thermal pathways comprise one or more carbon nanotubes;
a return line coupled to the supply line for receiving the warmed fluid, wherein the fluid from the supply line is warmed by capturing heat expelled from an exhaust opening of a server from the plurality of servers during operation and is then further warmed by capturing heat generated from an exhaust opening of a different server from the plurality of servers during operation before the supply line directs the fluid to the return line;
a chiller coupled to provide the fluid to the supply line and to received the warmed fluid from the return line, the chiller configured to use heat from the warmed fluid to cool a coolant; and
an air handling unit coupled to the chiller and to receive air from the environment external to the structure via the air supply unit, the air handling unit configured to receive air from the air supply unit, cool the air using the coolant from the chiller, and direct the cooled received air toward the plurality of severs.

15. The data center system of claim 14, further comprising an evaporative cooling system configured to receive air from the air supply unit, generate evaporatively cooled air, and supply the evaporatively cooled air to the air handling unit.

16. The data center system of claim 14, further comprising one or more sensors for monitoring an attribute of air proximate to the plurality of servers, the one or more sensors coupled to a control system which is coupled to the chiller and to the evaporative cooling system, the control system for generating a control signal modifying operation of the chiller or the evaporative cooling system responsive to the attribute.

17. The data center system of claim 16, wherein the control system is configured to generate a control signal to deactivate the chiller responsive to a temperature of the air proximate to the plurality of servers being less than or equal to a threshold value.

18. The data center system of claim 16, wherein the control system is configured to generate a control signal to activate the chiller responsive to a temperature of the air proximate to the plurality of servers equaling or exceeding a threshold value.

19. The data center system of claim 14, further comprising a thermal storage unit coupled to the return line and to the chiller, the thermal storage unit configured to receive the fluid, further warm the fluid using heat received from a heat source, and direct the additionally warmed fluid to the chiller.

20. The data center system of claim 19, wherein the heat source comprises at least one of a solar panel, a gas heater, and an electric heater.

21. The data center system of claim 14, further comprising:
a cold thermal storage unit coupled to the supply line, the cold thermal storage unit configured to capture the fluid before the fluid reaches the return line; and
a heat exchanger coupled to the cold thermal storage unit, the heat exchanger configured to cool the fluid and direct the cooled fluid to the servers.

22. The data center system of claim 14, wherein the chiller comprises an adsorption chiller, wherein the captured heat is used to regenerate a sorbet material.

23. The data center system of claim 22, further comprising:
a cooling tower coupled to the chiller, the cooling tower configured to supply a cooled fluid to the chiller to allow adsorption of vapor from an evaporator coupled to the chiller.

24. The data center system of claim 14, wherein the chiller comprises an absorption chiller.

25. The data center system of claim 24, further comprising:
a cooling tower coupled to the chiller, the cooling tower configured to extract heat from a refrigerant vapor produced by the chiller using the captured heat; and
an evaporator coupled to the chiller, the evaporator configured to receive the refrigerant after heat is extracted and generate a coolant having a temperature reduced by boiling of the refrigerant, the coolant directed to the air handling unit to cool the air from the air supply unit.

26. The data center system of claim 14, wherein the thermal pathway comprises at least one of a heat pipe, a vapor chamber, a liquid line, a vapor path, and a metal connection.

27. The data center system of claim 14, wherein the supply line partially includes the plurality of servers and includes a dielectric liquid immersing one or more components within the server, the dielectric liquid for capturing heat generated during operation of the one or more components.

28. The data center system of claim 14, further comprising:
an exhaust unit external to the plurality of servers and configured to extract air from the structure.

29. A method comprising:
operating a plurality of servers arranged in a structure, the plurality of servers generating heat during operation;
capturing at least a portion of the heat generated during operation of the plurality of servers to produce a heated fluid by directing heat from one or more components included in a server to a supply line adjacent to exhaust opening of the plurality of servers, the supply line including a fluid using a thermal pathway coupled to the one or more components and to the supply line, wherein the fluid directed via the supply line is a liquid and is warmed by capturing heat expelled from an exhaust opening of a server from the plurality of servers during operation and is then further warmed by capturing heat generated from an exhaust opening of a different server from the plurality of servers during operation before the supply line directs the fluid to a return line wherein the thermal pathway comprise one or more carbon nanotubes;
cooling a refrigerant in an absorption or adsorption process using energy from the heated fluid;
receiving ambient air from a source external to the structure;
cooling the ambient air using a heat exchange process between the ambient air received from the source external to the structure and the cooled refrigerant; and
directing the cooled air to the plurality of servers to cool the servers.

30. The method of claim 29, further comprising:
monitoring a temperature of air internal to the structure; and
responsive to the temperature of the air internal to the structure being less than or equal to a threshold value, deactivating the absorption or adsorption process.

31. The method of claim 30, further comprising:
responsive to the temperature of the air internal to the structure equaling or exceeding a maximum temperature, activating the absorption or adsorption process.

32. The method of claim 29, wherein directing the heated fluid to the chiller comprises:
increasing the temperature of the heated fluid unit using heat received from a heat source; and
using the additionally warmed heated fluid in the absorption or adsorption process.

33. The method of claim 29, wherein the thermal pathway comprises at least one of a heat pipe, a vapor chamber, a liquid line, a vapor path, and a metal connection.

34. The method of claim 29, wherein capturing at least the portion of the heat generated during operation of the plurality of servers to produce the heated fluid comprises immersing one or more components within a server in a dielectric liquid, the dielectric liquid for capturing heat generated during operation of the one or more components within the server.

* * * * *

UNITED STATES PATENT AND TRADEMARK OFFICE
CERTIFICATE OF CORRECTION

PATENT NO. : 8,820,113 B2  
APPLICATION NO. : 12/651282  
DATED : September 2, 2014  
INVENTOR(S) : Ali Heydari and Marco Magarelli Page 1 of 1

It is certified that error appears in the above-identified patent and that said Letters Patent is hereby corrected as shown below:

In the Specification

Column 9, line 11, after "toward the plurality of," delete "severs." and insert -- servers. --.
Column 10, line 37, after "toward the plurality of," delete "severs." and insert -- servers. --.

Signed and Sealed this
Twenty-eighth Day of July, 2015

Michelle K. Lee
*Director of the United States Patent and Trademark Office*